(12) United States Patent
Shirahata et al.

(10) Patent No.: US 10,118,191 B2
(45) Date of Patent: Nov. 6, 2018

(54) FILM FORMING APPARATUS

(71) Applicant: Toshiba Mitsubishi-Electric Industrial Systems Corporation, Chuo-ku (JP)

(72) Inventors: Takahiro Shirahata, Tokyo (JP); Hiroyuki Orita, Tokyo (JP)

(73) Assignee: Toshiba Mitsubishi-Electric Industrial Systems Corporation, Chuo-ku (JP)

( * ) Notice: Subject to any disclaimer, the term of this patent is extended or adjusted under 35 U.S.C. 154(b) by 0 days.

(21) Appl. No.: 15/509,006

(22) PCT Filed: Oct. 1, 2014

(86) PCT No.: PCT/JP2014/076310
§ 371 (c)(1),
(2) Date: Mar. 6, 2017

(87) PCT Pub. No.: WO2016/051559
PCT Pub. Date: Apr. 7, 2016

(65) Prior Publication Data
US 2017/0274410 A1    Sep. 28, 2017

(51) Int. Cl.
| | | |
|---|---|---|
| *B05C 5/02* | (2006.01) | |
| *B05C 9/06* | (2006.01) | |
| *B05C 9/14* | (2006.01) | |
| *C23C 16/455* | (2006.01) | |
| *C03C 17/00* | (2006.01) | |
| *C23C 16/448* | (2006.01) | |
| *H01L 21/31* | (2006.01) | |

(Continued)

(52) U.S. Cl.
CPC .......... *B05C 5/0279* (2013.01); *B05B 7/0012* (2013.01); *B05C 5/0254* (2013.01);
(Continued)

(58) Field of Classification Search
CPC .......... C23C 16/4486; C23C 16/45502; C23C 16/45514; C23C 16/45517;
(Continued)

(56) References Cited

U.S. PATENT DOCUMENTS 7,913,643 B2 * 3/2011 Goto ..................... C03C 17/001
118/302
2009/0191350 A1 * 7/2009 Goto ..................... C03C 17/001
427/421.1

(Continued)

FOREIGN PATENT DOCUMENTS

| JP | 2000-100834 A | 4/2000 |
|---|---|---|
| JP | 2001-205151 A | 7/2001 |

(Continued)

OTHER PUBLICATIONS

Office Action dated Jun. 20, 2017 in Japanese Patent Application No. 2016-551427 (with partial English translation).

(Continued)

*Primary Examiner* — Laura Edwards
(74) *Attorney, Agent, or Firm* — Oblon, McClelland, Maier & Neustadt, L.L.P.

(57) ABSTRACT

A film forming apparatus includes a mist spray head for spraying a raw material. The mist spray head includes a raw material spray nozzle and a raw material ejection part for ejecting an atomized raw material, and the raw material spray nozzle includes a cavity and a raw material discharge part which is drilled in a side surface of the cavity, being away from a bottom surface of the cavity, and is connected to the raw material ejection part.

27 Claims, 7 Drawing Sheets

(51) Int. Cl.
  *H01L 21/67* (2006.01)
  *B05B 7/00* (2006.01)
  *B05B 17/06* (2006.01)
(52) U.S. Cl.
  CPC .............. *B05C 9/06* (2013.01); *B05C 9/14* (2013.01); *C03C 17/001* (2013.01); *C23C 16/4486* (2013.01); *C23C 16/45514* (2013.01); *C23C 16/45517* (2013.01); *C23C 16/45563* (2013.01); *H01L 21/31* (2013.01); *H01L 21/67017* (2013.01); *B05B 17/06* (2013.01)
(58) Field of Classification Search
  CPC ........ C23C 16/45519; C23C 16/45563; B05C 5/0279; B05C 5/0254; B05C 9/06; B05C 9/14; C03C 17/001; H01L 21/67017; H01L 21/31; B05B 7/025; B05B 17/06; B05B 7/0012
  USPC .......................................... 118/313, 300, 715
  See application file for complete search history.

(56) References Cited

U.S. PATENT DOCUMENTS

| | | |
|---|---|---|
| 2010/0101642 A1 | 4/2010 | Kaneko et al. |
| 2011/0244130 A1 | 10/2011 | Abendroth et al. |
| 2013/0247820 A1 | 9/2013 | Orita et al. |
| 2014/0141170 A1 | 5/2014 | Orita et al. |

FOREIGN PATENT DOCUMENTS

| | | |
|---|---|---|
| TW | 201418894 A | 5/2014 |
| WO | 2008/117605 A1 | 10/2008 |
| WO | 2012/124047 A1 | 9/2012 |
| WO | 2013/038484 A1 | 3/2013 |
| WO | 2014/068778 A1 | 5/2014 |

OTHER PUBLICATIONS

International Preliminary Report on Patentability and Written Opinion dated Apr. 13, 2017 in PCT/JP2014/076310 (with English language translation).

Taiwanese Office Action dated Feb. 25, 2016 in Taiwanese Patent Application No. TW 104100218 (with partial English translation), 13 pages.

International Search Report dated Feb. 3, 2015 in PCT/JP2014/076310 filed Oct. 1, 2014.

Office Action dated Feb. 6, 2018 in the corresponding Japanese Application No. 2016-551427 (with Partial English Translation of Notification of Decision of Refusal.

Office Action dated Jun. 21, 2018, in Korean Patent Application No. 10-2017-7008886 w/Machine Generated English language Translation.

\* cited by examiner

FILM FORMING APPARATUS

TECHNICAL FIELD

The present invention relates to a film forming apparatus for forming a film on a substrate.

BACKGROUND ART

Chemical vapor deposition (CVD) method is known as a method of forming a film on a substrate. However, a film formation under vacuum is necessary in the CVD method, so that a large-sized vacuum case is necessary in addition to a vacuum pump, for example. Moreover, the CVD method has a problem that it is difficult to adopt a large-area substrate as a substrate on which the film is formed in terms of cost, for example. Accordingly, a mist method which enables a film formation processing in an atmospheric pressure attracts attention.

A technique of a prior art relating to a film forming apparatus using the mist method is described in Patent Document 1, for example.

In the technique of Patent Document 1, an atomized raw material is sprayed from a mist spray nozzle to a substrate disposed in an atmosphere. A predetermined film is formed on the substrate by the spray.

PRIOR ART DOCUMENT

Patent Document

Patent Document 1: International Publication No. WO 2013/038484

SUMMARY OF INVENTION

Problems to be Solved by the Invention

However, the mist spray nozzle disclosed in Patent Document 1 has a problem described below. That is to say, an atomized solution may react with a residual moisture in a space in the mist spray nozzle and particles are generated, and the particles are attached near a spray orifice, thereby causing a clogging of the spray orifice.

It is an object of the present invention to provide a film forming apparatus having a mist spray nozzle which enables a prevention of a generation of a clogging.

Means for Solving the Problems

In order to achieve the above-mentioned object, a film forming apparatus according to the present invention is a film forming apparatus which sprays an atomized raw or first material to an atmosphere so as to form a film on a substrate, including: a mounting part on which the substrate is mounted; and a mist spray head which sprays the raw material to an upper surface of a substrate mounted on the mounting part, wherein the mist spray head includes a raw material spray nozzle which sprays the raw material and a raw material ejection part which is provided in a side of the mist spray head facing the substrate, so that the atomized raw material is sprayed to the substrate, and the raw material spray nozzle includes a first cavity, a raw material supply part which supplies the atomized raw material into the first cavity, and a raw material discharge part which is drilled in a side surface of the first cavity, being away from a bottom surface of the first cavity, and is connected to the raw material ejection part.

Effects of the Invention

A film forming apparatus according to the present invention is a film forming apparatus which sprays an atomized raw material to an atmosphere so as to form a film on a substrate, including: a mounting part on which the substrate is mounted; and a mist spray head which sprays the raw material to an upper surface of a substrate mounted on the mounting part, wherein the mist spray head includes a raw material spray nozzle which sprays the raw material and a raw material ejection part which is provided in a side of the mist spray head facing the substrate, so that the atomized raw material is sprayed to the substrate, and the raw material spray nozzle includes a first cavity, a raw material supply part which supplies the atomized raw material into the first cavity, and a raw material discharge part which is drilled in a side surface of the first cavity, being away from a bottom surface of the first cavity, and is connected to the raw material ejection part.

Accordingly, even when the raw material and a residual moisture react with each other in the cavity in the raw material spray nozzle and particles are thereby generated, the particles are trapped in a region between the bottom surface of the cavity and the raw material discharge part. Thus, an attachment of the particles and a clogging caused by the attachment in the raw material ejection part can also be prevented.

PREFERRED EMBODIMENTS FOR IMPLEMENTING THE INVENTION

The invention is specifically described below based on drawings for showing embodiments thereof.

Embodiment 1

Figure 1:
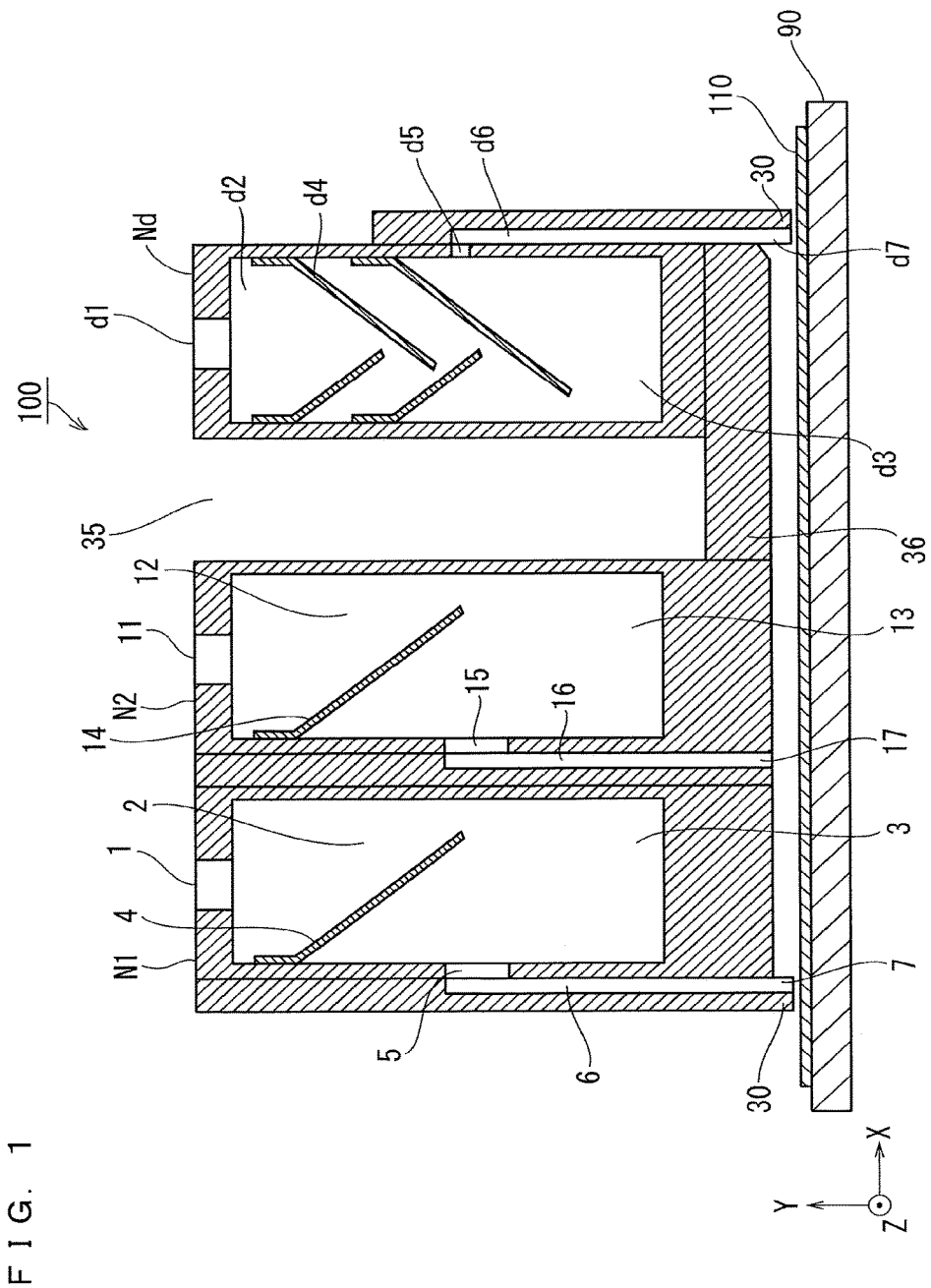
FIG. 1 is an enlarged cross sectional view showing a configuration of a mist spray head 100 according to an embodiment 1.
Figure 2:
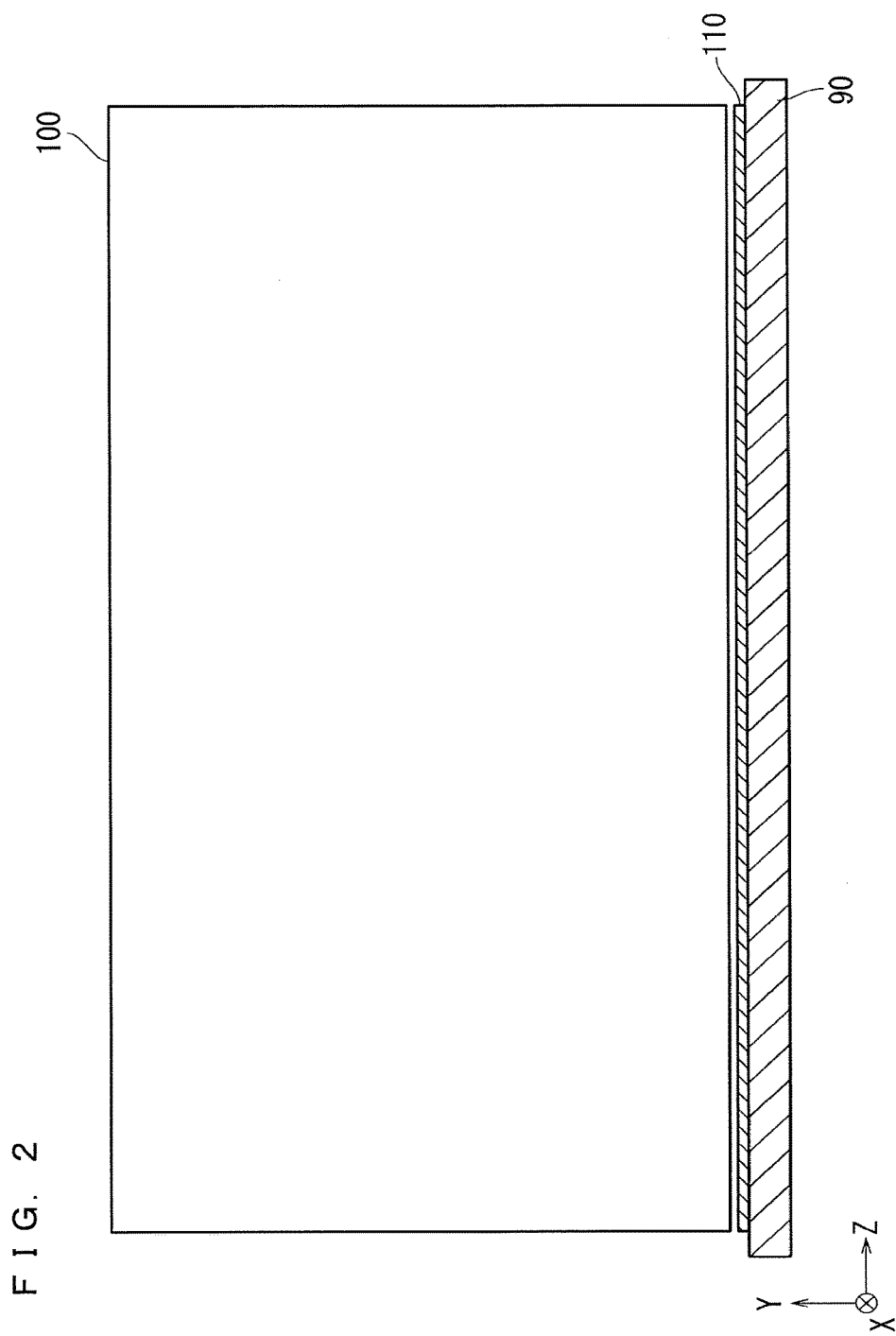
FIG. 2 is an enlarged side view showing a configuration of the mist spray head 100 according to the embodiment 1.

FIG. 1 is a cross sectional view showing a main configuration (that is to say, a mist spray head 100) of a film forming apparatus according to the present embodiment. FIG. 1 also includes an X-Y-Z coordinate axis. FIG. 2 is a drawing showing an appearance of the mist spray head 100 viewed in an X direction. FIG. 2 also includes an X-Y-Z coordinate axis.

The film forming apparatus sprays an atomized raw material into an atmosphere, thereby forming a film on the substrate 110. That is to say, the film forming apparatus forms a desired film on the substrate 110 using a mist method, which indicates a film forming processing in the atmosphere.

Specifically, the raw material is placed in a case not shown in the drawings, and using ultrasonic vibration, the raw material is atomized in the case. The atomized raw material passes through a route not shown in the drawings together with a carrier gas and is conveyed to the mist spray head 100.

The substrate 110 is disposed on a mounting part 90 which also functions as a heater. That is to say, the mounting part 90 can heat the substrate 110. The mist spray head 100 is disposed over the substrate 110. Herein, a distance between a bottom surface of the mist spray head 100 and an upper surface of the substrate 110 is substantially 0.1 mm to 50 mm at a time of film forming processing. The mist spray head 100 and the substrate 110 are disposed in an atmospheric pressure. A space between a bottom surface of the mist spray head 100 and the upper surface of the substrate 110 is referred to as a reaction space hereinafter.

The mist spray head 100 sprays the atomized raw material to the upper surface of the substrate 110 which is heated at a predetermined temperature. Accordingly, the desired film is formed on the upper surface of the substrate 110. The mounting part 90 moves in a horizontal direction (in an X-Z plane) at the time of film forming processing. The mist spray head 100 moves in the horizontal direction.

The configuration of the mist spray head 100 is specifically described using the drawings.

As shown in FIG. 1, the mist spray head 100 includes a raw material spray nozzle N1, a reaction material spray nozzle N2, and an exhaust nozzle Nd. As shown in FIG. 1, the raw material spray nozzle N1, the reaction material spray nozzle N2, and the exhaust nozzle Nd are arranged side by side in this order along the X direction. Differing from FIG. 1, it is also applicable to arrange the reaction material spray nozzle N2, the raw material spray nozzle N1, and the exhaust nozzle Nd side by side in this order along the X direction.

A side surface of the raw material spray nozzle N1 and a side surface of the reaction material spray nozzle N2 are in contact with each other, and other side surface of the reaction material spray nozzle N2 and a side surface of the exhaust nozzle Nd are separated by a predetermined distance. That is to say, the raw material spray nozzle N1 and the reaction material spray nozzle N2 are adjacent to each other in the X direction, and the exhaust nozzle Nd is disposed separately from other nozzles N1 and N2 in the X direction.

As described above, the raw material spray nozzle N1, the reaction material spray nozzle N2, and the exhaust nozzle Nd are arranged side by side in the horizontal direction (the X direction). Herein, at least the exhaust nozzle Nd is located on an outermost side of the mist spray head 100 (a right end in FIG. 1).

A configuration of the raw material spray nozzle N1 is described first.

The raw material spray nozzle N1 is a nozzle for spraying the atomized raw material. Cavities (referred to as a first cavity) 2 and 3 are formed inside the raw material spray nozzle N1. A raw material supply part 1 is provided in an upper surface of the raw material spray nozzle N1. As described above, the raw material is atomized outside the mist spray head 100. The atomized raw material passes through a route not shown in the drawings together with a carrier gas and is conveyed to the raw material supply part 1. An atomized material which is output from the raw material supply part 1 fills (is supplied to) the cavities 2 and 3 in the raw material spray nozzle N1.

A straightening part (referred to as a first straightening part) 4 is provided on one side surface portion in the cavities 2 and 3 of the raw material spray nozzle N1. The straightening part 4, which is a straightening plate, can straighten a flow of the atomized raw material supplied from the raw material supply part 1 in the cavities 2 and 3.

The straightening part 4 extends from the one side surface portion toward other side surface portion in the cavities 2 and 3 in the raw material spray nozzle N1. Herein, the other side surface portion faces the one side surface portion in the X direction. One edge portion of the straightening part 4 is attached to the one side surface portion near an upper part of the raw material spray nozzle N1, however, other edge portion of the straightening part 4 is not connected to the other side surface portion, so that a small gap is formed between the other edge portion and the other side surface portion. The straightening part 4 is provided in the cavities 2 and 3 so as to extend obliquely in a lower direction from the one edge portion to the other edge portion.

The straightening part 4 separates the cavities 2 and 3 into a small space 2 located in an upper part of the raw material spray nozzle N1 and a small space 3 located in a lower part of the raw material spray nozzle N1. The small space 2 and the small space 3 are connected to each other via the gap formed between the other edge portion of the straightening part 4 and the other side surface portion. The small space 2 is connected to the raw material supply part 1, and the small space 3 is connected to a raw material discharge part 5 which will be described hereinafter.

The raw material discharge part 5 is provided on the one side surface portion described above in the cavities 2 and 3 (more specifically, the small space 3). The raw material discharge part 5 is provided in a position being away from a bottom surface of the raw material spray nozzle N1 (the cavities 2 and 3).

In the mist spray head 100, a raw material ejection part 7 is provided in the bottom surface of the mist spray head 100, that is to say, in a side of the mist spray head 100 which faces the substrate 110. The atomized raw material is ejected from the raw material ejection part 7 to the substrate 110.

Figure 3:
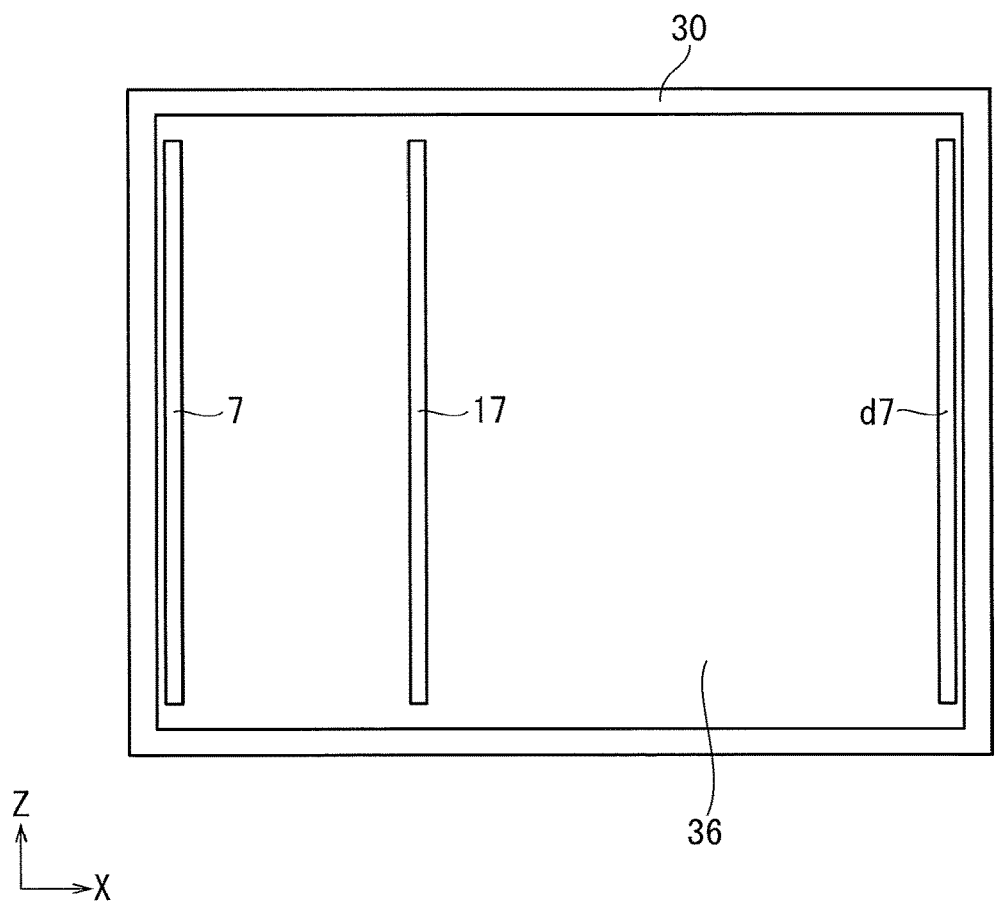
FIG. 3 is a plan view showing an appearance of the mist spray head 100 according to the embodiment 1 viewed from a substrate 110.

A path 6 is provided in the mist spray head 100. The raw material discharge part 5 is connected to the raw material ejection part 7 via the path 6. FIG. 3 is a plan view of the mist spray head 100 viewed from a side where the substrate 110 is located. That is to say, FIG. 3 is the plan view showing a bottom surface structure of the mist spray head 100. As shown in FIG. 3, the raw material ejection part 7 forms an elongated opening hole having a slit-like shape. A width of the opening (a size in an X direction in FIG. 3) is substantially 0.1 mm to 10 mm.

In the raw material spray nozzle N1, the atomized raw material is supplied from the raw material supply part 1 into the cavities 2 and 3. Then, the raw material is straightened by the straightening part 4 and fills the small space 2, and subsequently, it is led to the small space 3 to fill the small space 3. Then, the atomized raw material is lead from the raw material discharge part 5 to the raw material ejection part 7 via the path 6. The atomized raw material is ejected from the raw material ejection part 7 toward the upper surface of the substrate 110.

Next, a configuration of the reaction material spray nozzle N2 is described.

The reaction material spray nozzle N2 is a nozzle for ejecting a reaction material which contributes to a reaction with the raw material (for example, an oxidizing agent) to the substrate 110. Cavities (referred to as a second cavity) 12 and 13 are formed inside the reaction material spray nozzle N2. A reaction material supply part 11 is provided in an upper surface of the reaction material spray nozzle N2. The reaction material is supplied from outside the reaction material spray nozzle N2 into the cavities 12 and 13 via the reaction material supply part 11.

Herein, the reaction material may be gas or liquid. When the reaction material is the liquid, the liquid (the reaction material) atomized using ultrasonic vibration, for example, passes through a route not shown in the drawings together with a carrier gas and is conveyed to the reaction material spray nozzle N2. The reaction material which is output from the reaction material supply part 1 fills (is supplied to) the cavities 12 and 13 in the reaction material spray nozzle N2.

A straightening part (referred to as a second straightening unit) 14 is provided on one side surface portion in the cavities 12 and 13 of the reaction material spray nozzle N2. The straightening part 14, which is a straightening plate, can straighten a flow of the reaction material supplied from the reaction material supply part 11 in the cavities 12 and 13.

The straightening part 14 extends from one side surface portion toward other side surface portion in the cavities 12 and 13 of the reaction material spray nozzle N2. Herein, the other side surface portion faces the one side surface portion described above in the X direction. One edge portion of the straightening part 14 is attached to the one side surface portion near an upper part of the reaction material spray nozzle N2, however, other edge portion of the straightening part 14 is not connected to the other side surface portion, so that a small gap is formed between the other edge portion and the other side surface portion. The straightening part 14 is provided in the cavities 12 and 13 so as to extend obliquely in a lower direction from the one edge portion to the other edge portion.

The straightening part 14 separates the cavities 12 and 13 into a small space 12 located in an upper part of the reaction material spray nozzle N2 and a small space 13 located in a lower part of the reaction material spray nozzle N2. The small space 12 and the small space 13 are connected to each other via the gap formed between the other edge portion of the straightening part 14 and the other side surface portion. The small space 12 is connected to the reaction material supply part 11, and the small space 13 is connected to a reaction material discharge part 15 which will be described hereinafter.

The reaction material discharge part 15 is provided on the one side surface portion described above in the cavities 12 and 13 (more specifically, the small space 13). The reaction material discharge part 15 is provided in a position being away from a bottom surface of the reaction material spray nozzle N2 (the cavities 12 and 13).

In the mist spray head 100, a reaction material ejection part 17 is provided in the bottom surface of the mist spray head 100, that is to say, in a side of the mist spray head 100 which faces the substrate 110. The reaction material is ejected from the reaction material ejection part 17 to the substrate 110.

A path 16 is provided in the mist spray head 100. The reaction material discharge part 15 is connected to the reaction material ejection part 17 via the path 16. As shown in FIG. 3, the reaction material ejection part 17 forms an elongated opening hole having a slit-like shape. A width of the opening (a size in the X direction in FIG. 3) is substantially 0.1 mm to 10 mm.

The reaction material is supplied from the reaction material supply part 11 into the cavities 12 and 13 in the reaction material spray nozzle N2. Then, the reaction material is straightened by the straightening part 14 and fills the small space 12, and subsequently, it is led to the small space 13 to fill the small space 13. Then, the reaction material is led from the reaction material discharge part 15 to the reaction material ejection part 17 via the path 16. The reaction material is ejected from the reaction material ejection part 17 to the upper surface of the substrate 110.

Next, a configuration of the exhaust nozzle Nd is described.

The exhaust nozzle Nd is a nozzle for performing an exhaust processing. The exhaust nozzle Nd performs the exhaust processing at a flow rate (Q3) which is equal to or larger than a sum of a flow rate (Q1) at which the raw material spray nozzle N1 ejects the raw material and a flow rate (Q2) at which the reaction material spray nozzle N2 ejects the reaction material. That is to say, the following equation is true: the exhaust flow rate Q3≥the ejection flow rate of the raw material Q1+the ejection flow rate of the reaction material Q2.

Cavities (referred to as a third cavity) d2 and d3 are formed inside the exhaust nozzle Nd. An exhaust material outlet d1 is provided in an upper surface of the exhaust nozzle Nd. The exhaust material outlet d1 is provided in the upper surface of the exhaust nozzle Nd, and specifically, the exhaust material outlet d1 is provided superior to an exhaust material introduction part d5, which will be described hereinafter, to discharge the exhaust material outside the exhaust nozzle Nd from the cavities d2 and d3.

Herein, the exhaust material indicates a reaction residue generated in the reaction space, for example. The exhaust material output part d1 is connected to an exhaust pump not shown via a route not shown. That is to say, the exhaust material is sucked from the exhaust nozzle Nd into the exhaust pump described above via the exhaust material outlet d1 and the route described above.

A plurality of straightening parts (referred to as a third straightening part) d4 are provided in the cavities d2 and d3 of the exhaust nozzle Nd. The straightening parts d4, which are straightening plates, can straighten a flow of the exhaust material introduced from an exhaust material introduction part d5, which will be described hereinafter, in the cavities d2 and d3.

Some of the straightening parts d4 are attached to one side surface portion of the cavities d2 and d3, and remaining straightening parts d4 are attached to other side surface portion of the cavities d2 and d3. Herein, the other side surface portion faces the one side surface portion in the X direction. Each straightening part d4 attached to the one side surface portion extends toward the other side surface portion, and each straightening part d4 attached to the other side surface portion extends toward the one side surface portion.

When one edge portion of the straightening part d4 is attached to the one side surface portion, other edge portion of the straightening part d4 forms a free edge which is not connected to any of members in the cavities d2 and d3. When one edge portion of the straightening part d4 is attached to the other side surface portion, other edge portion of the straightening part d4 forms a free edge which is not connected to any of the members in the cavities d2 and d3. Each straightening part 4 is provided in the cavities d2 and d3 so as to extend obliquely in a lower direction from the one edge portion to the other edge portion. Herein, the straightening part d4 attached to the one side surface portion and the straightening part d4 attached to the other side surface portion are alternately arranged from an upper side to a lower side of the exhaust nozzle Nd.

The plurality of straightening parts d4 separate the cavities d2 and d3 of the exhaust nozzle Nd into a plurality of small spaces. The small spaces which are adjacent to each other are connected via small gaps formed by the straightening parts d4. The plurality of small spaces include a small space d2 located in an uppermost portion of the exhaust nozzle Nd and a small space d3 located in a lowermost portion of the exhaust nozzle Nd. The small space d2 is connected to the exhaust material outlet d1, and the small space d3 is connected to the exhaust material introduction part d5 which will be described hereinafter.

The exhaust material introduction part d5 is provided on the other side surface portion described above in the cavities d2 and d3 (more specifically, the small space d3). The exhaust material introduction part d5 is provided in a position being away from a bottom surface of the exhaust nozzle Nd (the cavities d2 and d3).

In the mist spray head 100, an exhaust part d7 is provided in the bottom surface of the mist spray head 100, that is to say, in the side of the mist spray head 100 which faces the substrate 110. Herein, the exhaust part d7 performs an exhaust processing on the reaction space.

The path d6 is provided in the mist spray head 100. The exhaust material introduction part d5 is connected to the exhaust part d7 via the path d6. As shown in FIG. 3, the exhaust part d7 forms an elongated opening hole having a slit-like shape. A width of the opening (a size in the X direction in FIG. 3) is substantially 0.1 mm to 10 mm.

As shown in FIGS. 1 and 3, the raw material ejection part 7, the reaction material ejection part 17, and the exhaust part d7 are arranged in this order in the X direction. Although differing from the drawings, the reaction material ejection part 17, the raw material ejection part 7, and the exhaust part d7 may be arranged in this order in the X direction.

In the exhaust nozzle Nd, the exhaust material in the reaction space is sucked from the exhaust part d7. The exhaust material is conveyed to the exhaust material introduction part d5 via the path d6. The exhaust material which is output from the exhaust material introduction part d5 to the small space d3 is straightened by the straightening part d4 and then moves to the small space d2. Subsequently, the exhaust material is discharged outside the exhaust nozzle Nd via the exhaust material outlet d1.

As described above, the exhaust nozzle Nd is disposed separately from the other nozzles N1 and N2 in the X direction. Accordingly, an open ceiling part 35 is generated between the exhaust nozzle Nd and the other nozzles N1 and N2. Thus, the mist spray head 100 is provided with a base plate part 36. The base plate part 36 covers the open ceiling part 35 from a side where the substrate 110 is located (refer to FIGS. 1 and 3).

With reference to FIG. 3, the mist spray head 100 includes a frame 30 of the mist spray head 100 in the side (bottom surface) of the mist spray head 100 which faces the substrate 110. The frame 30, which is an edge portion of the bottom surface of the mist spray head 100, rims and surrounds an inner portion side of the bottom surface of the mist spray head 100. As can be seen from FIG. 1, the frame 30 protrudes toward the substrate 110 side.

That is to say, the reaction space is enclosed by the frame 30. However, the edge portion of the frame 30 and the upper surface of the substrate 110 are not in contact with each other.

When the atomized raw material and the reaction material are sprayed to the reaction space, the raw material and the reaction material react with each other on the heated substrate 110, and the desired film is thereby formed on the upper surface of the substrate 110. A reaction residue generated in the reaction space, for example, is removed from the reaction space by the exhaust nozzle Nd.

As described above, the film forming apparatus according to the present embodiment includes the mist spray head 100, and the mist spray head 100 includes the raw material spray nozzle N1. The raw material spray nozzle N1 is provided with, in the cavities 2 and 3, the raw material discharge part 5 provided in the one side surface portion being away from the bottom surface of the cavities 2 and 3.

Accordingly, even when the raw material and a residual moisture react with each other in the cavities 2 and 3 in the raw material spray nozzle N1 and particles are thereby generated, the particles are trapped in a region between the bottom surface and the raw material discharge part 5 in the small space 3. That is to say, the above region in the small space 3 functions as a particle trap, and the particles are captured in the above region, so that the particles can be prevented from being conveyed to the raw material discharge part 5, the path 6, and the raw material ejection part 7. Thus, an attachment of the particles to the parts 5, 6, and 7 and a clogging caused by the attachment can also be prevented.

Although, differing from the above configuration, the installation of the straightening part 4 may be omitted, the straightening part 4 is provided in the cavities 2 and 3 in the raw material spray nozzle N1.

Accordingly, the flow of the atomized raw material can be straightened in the cavities 2 and 3, and the particles can be captured more reliably in the region functioning as the particle trap. The side surface portion to which the straightening part 4 is attached is the same as the side surface in which the raw material discharge part 5 is provided (both the parts 4 and 5 are provided in the one side surface portion). Thus, a liquid drop, for example, can be prevented from running down the one side surface portion and flowing into the raw material discharge part 5.

The raw material ejection part 7 forms the elongated opening hole having the slit-like shape. Accordingly, the atomized raw material can be sprayed evenly to the substrate 110 having a large surface area.

Although, differing from the above configuration, the installation of the reaction material spray nozzle N2 may be omitted, the mist spray head 100 has the reaction material spray nozzle N2. Accordingly, the reaction can be enhanced in the film forming processing in the atmosphere. A wide variety of films can be formed.

The reaction material spray nozzle N2 is provided with, in the cavities 12 and 13, the reaction material discharge part 15 located in the one side surface portion being away from the bottom surface of the cavities 12 and 13.

Accordingly, even when the reaction material and the atmosphere react with each other in the cavities 12 and 13 in the reaction material spray nozzle N2 and particles are thereby generated, the particles are trapped in a region between the bottom surface and the reaction material discharge part 15 in the small space 13.

That is to say, the above region in the small space 13 functions as a particle trap, and the particles are captured in the above region, so that the particles can be prevented from being conveyed to the reaction material discharge part 15, the path 16, and the reaction material ejection part 17. Thus, an attachment of the particles to the parts 15, 16, and 17 and a clogging caused by the attachment can also be prevented.

Although, differing from the above configuration, the installation of the straightening part 14 can be omitted, the straightening part 14 is provided in the cavities 12 and 13 in the reaction material spray nozzle N2.

Accordingly, the flow of the reaction material can be straightened in the cavities 12 and 13, and the particles can be captured more reliably in the region functioning as the particle trap. The side surface portion to which the straightening part 14 is attached is the same as the side surface in which the reaction material discharge part 15 is provided (both the parts 14 and 15 are provided in the one side surface portion). Thus, a liquid drop, for example, can be prevented from running down the one side surface portion and flowing into the reaction material discharge part 15.

The reaction material ejection part 17 forms the elongated opening hole having the slit-like shape. Accordingly, the reaction material can be sprayed evenly to the substrate 110 having the large surface area.

Although, differing from the above configuration, the installation of the exhaust nozzle Nd may be omitted, the mist spray head 100 has the exhaust nozzle Nd. Accordingly, the flow of the raw material and reaction material moving to the exhaust nozzle Nd can be generated. Thus, a turbulence in the flow of the raw material, for example, in the reaction space can be prevented, so that a film quality of the film to be formed can be enhanced. A diffusion of the raw material, for example, outside the reaction space can be suppressed.

The following equation is true in the exhaust processing: the exhaust flow rate Q3≥the ejection flow rate of the raw material Q1+the ejection flow rate of the reaction material Q2. Accordingly, the raw material and reaction material sprayed in the reaction space can further ensure the flow described above in the reaction space. A diffusion of the raw material and the reaction material outside the reaction space can be reliably prevented.

The raw material spray nozzle N1, the reaction material spray nozzle N2, and the exhaust nozzle Nd are arranged side by side along the X direction, and at least the exhaust nozzle Nd is located on the outermost side of the mist spray head 100.

Accordingly, the raw material and the reaction material moves to the outermost side of the mist spray head 100 in the reaction space. Accordingly, a region where the raw material and the reaction material contacts the substrate 110 is maximized, so that a generation of an unreacted raw material, for example, in the reaction space can be minimized.

The exhaust nozzle Nd is provided with, in the cavities d2 and d3, the exhaust material introduction part d5 located in the other side surface portion being away from the bottom surface of the cavities d2 and d3.

Accordingly, the exhaust material taken from the exhaust material introduction part d5 into the cavities d2 and d3 is trapped in a region between the bottom surface and the exhaust material introduction part d5 in the small space d3. That is to say, the above region in the small space d3 functions as a particle trap, and the exhaust material having a large particle size is captured in the above region, so that the exhaust material having the large particle size can be prevented from flowing beyond the exhaust material output d1. According to the above configuration, a lifetime of a filter provided in the exhaust pump can be prolonged.

Although, differing from the above configuration, the installation of the straightening part d4 can be omitted, the plurality of straightening parts d4 are provided in the cavities d2 and d3 in the exhaust nozzle Nd.

Accordingly, the exhaust material having the large particle size can be reliably prevented from flowing beyond the exhaust material output d1. According to the above configuration, the lifetime of the filter provided in the exhaust pump can be further prolonged.

The exhaust part d7 forms the elongated opening hole having the slit-like shape. Accordingly, the exhaust processing can be performed over a wider range. The flow of the raw material, for example, to the exhaust part d7 in the X direction can be equalized.

The mist spray head 100 has the base plate part 36 covering the open ceiling part 35 from the side where the substrate 110 is located. Accordingly, even when the exhaust nozzle Nd is disposed separately from the other nozzles N1 and N2, the raw material, for example, can be prevented from flowing from the reaction space into the open ceiling part 35. The exhaust nozzle Nd and the other nozzles N1 and N2 can be easily assembled in the mist spray head 100.

The frame 30 of the mist spray head 100 protrudes toward the substrate 110 side. Accordingly, the reaction space can be enclosed, so that the diffusion of the raw material, for example, from the reaction space can be suppressed.

The mounting part 90 or the mist spray head 100 can move in the horizontal direction. Accordingly, the film forming processing using the film forming apparatus according to the present embodiment (the mist spray head 100) can be performed on an entire surface of the substrate 110 having the large surface area.

Embodiment 2

In the present embodiment, two reaction material spray nozzle are applied.

Figure 4:
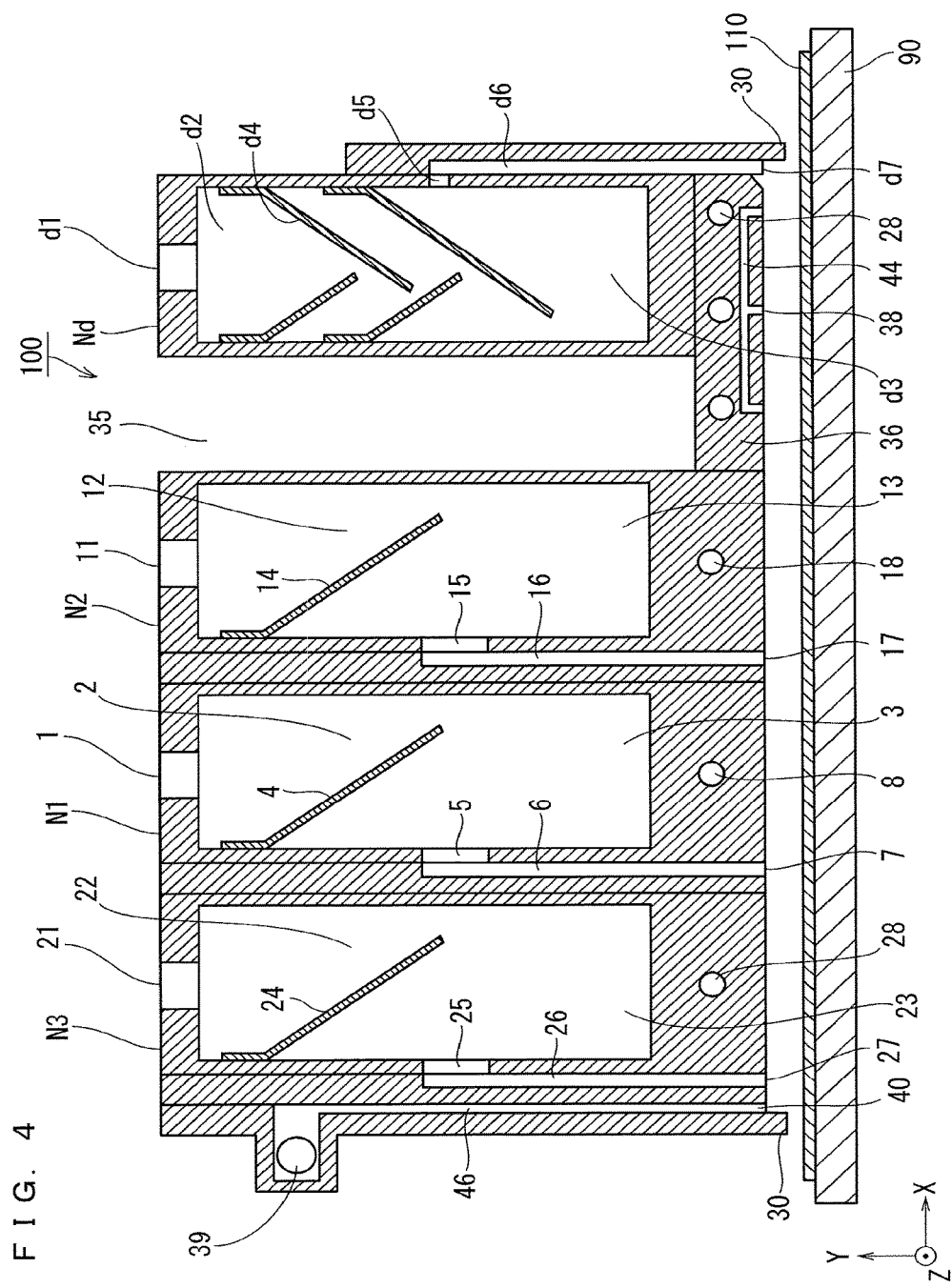
FIG. 4 is an enlarged cross sectional view showing a configuration of the mist spray head 100 according to an embodiment 2.
Figure 5:
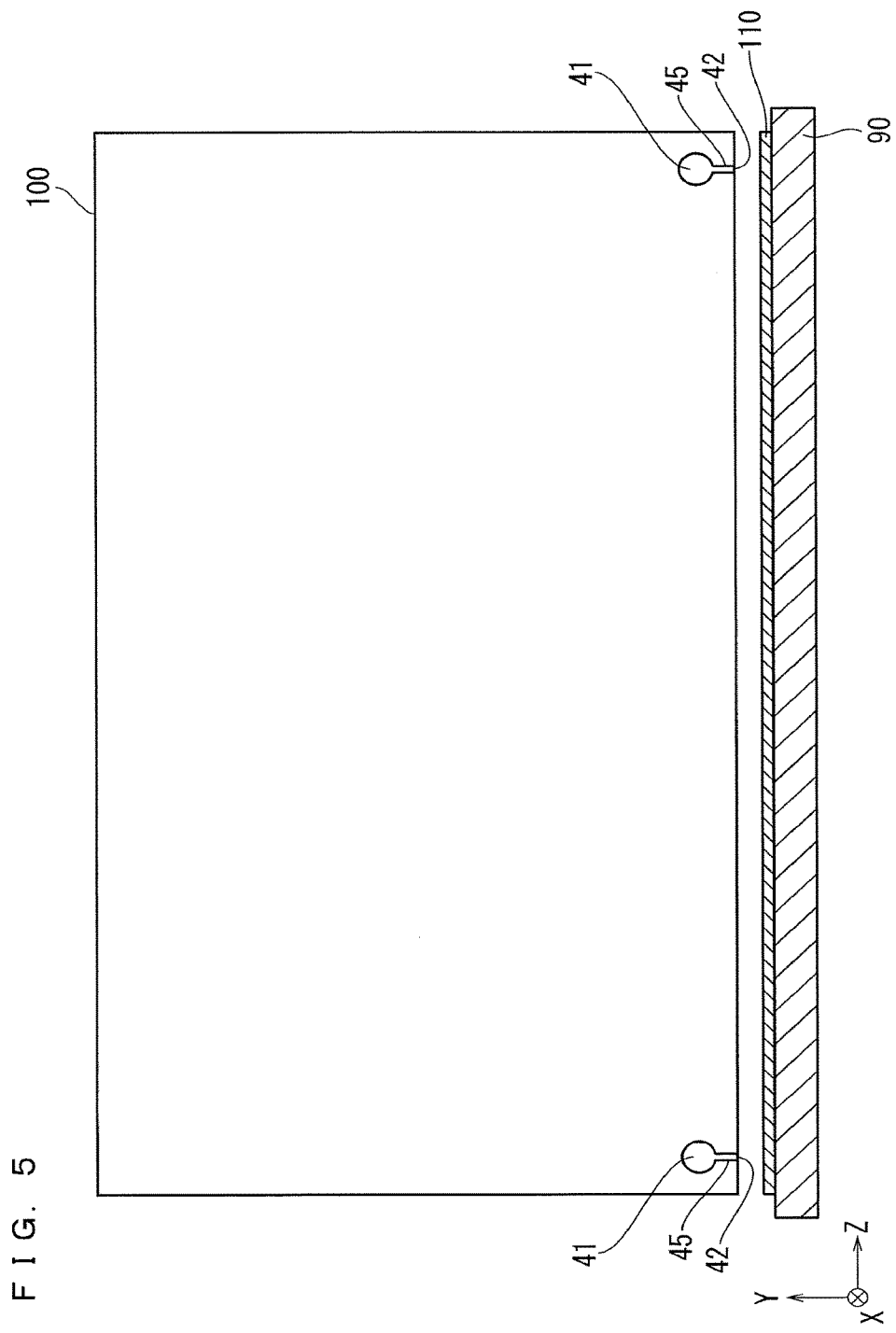
FIG. 5 is an enlarged side view showing a configuration of the mist spray head 100 according to the embodiment 2.
Figure 6:
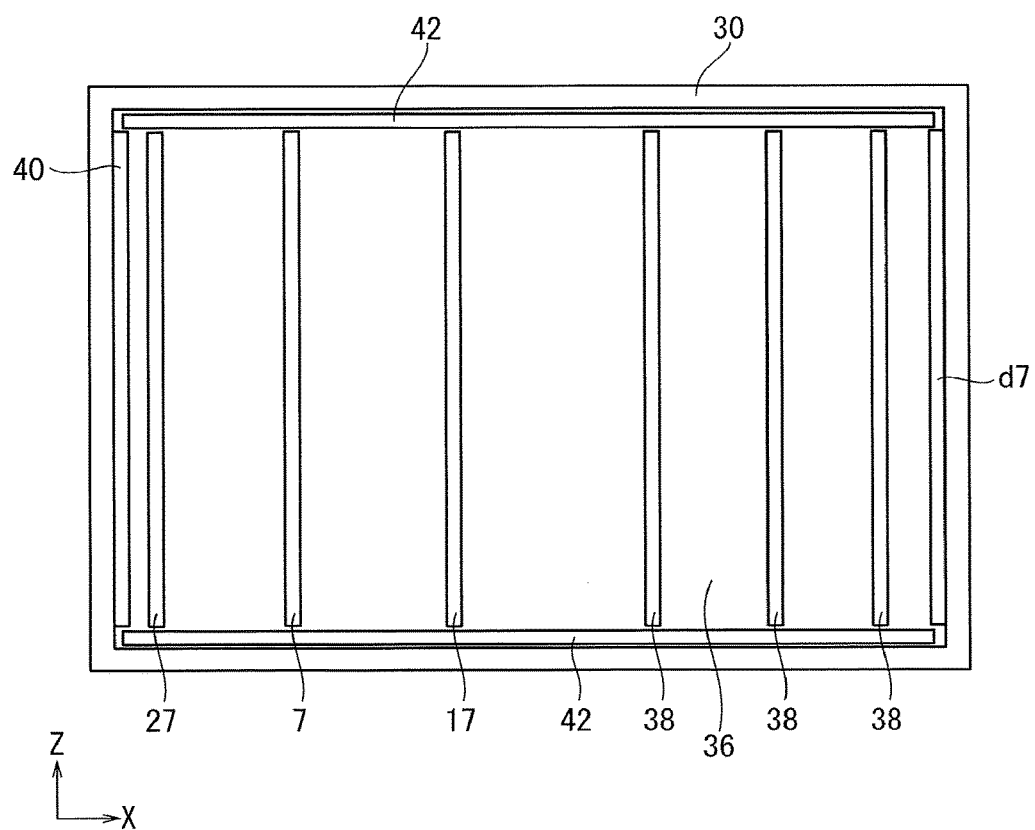
FIG. 6 is a plan view showing an appearance of the mist spray head 100 according to the embodiment 2 viewed from the substrate 110.

FIG. 4 is a cross sectional view showing a main configuration (that is to say, a mist spray head 100) of a film forming apparatus according to the present embodiment. FIG. 4 also includes an X-Y-Z coordinate axis. FIG. 5 is a drawing showing an appearance of the mist spray head 100 shown in FIG. 4 viewed in an X direction. FIG. 5 also includes an X-Y-Z coordinate axis. FIG. 6 is a plan view showing the mist spray head 100 shown in FIG. 4 viewed from a side where the substrate 110 is located. That is to say, FIG. 6 is a plan view showing a bottom surface structure of the mist spray head 100 shown in FIG. 4.

The configuration of the mist spray head 100 according to the present embodiment is specifically described using the drawings.

As shown in FIG. 4, the mist spray head 100 includes a reaction material spray nozzle N3, a raw material spray nozzle N1, a reaction material spray nozzle N2, and an exhaust nozzle Nd. As shown in FIG. 4, the reaction material spray nozzle N3, the raw material spray nozzle N1, the reaction material spray nozzle N2, and the exhaust nozzle Nd are arranged side by side in this order along the X direction. That is to say, the raw material spray nozzle N1 is sandwiched between the reaction material spray nozzle N2 located in one side and the reaction material spray nozzle N3 located in other side from a lateral side (in the X direction).

A side surface of the raw material spray nozzle N1 and a side surface of the reaction material spray nozzle N2 are in contact with each other. Other side surface of the raw material spray nozzle N1 and a side surface of the reaction material spray nozzle N3 are in contact with each other. However, other side surface of the reaction material spray nozzle N2 and a side surface of the exhaust nozzle Nd are separated by a predetermined distance. That is to say, the reaction material spray nozzle N3, the raw material spray nozzle N1, and the reaction material spray nozzle N2 are adjacent to each other in the X direction, and the exhaust nozzle Nd is disposed separately from other nozzles N1, N2, and N3 in the X direction.

As described above, the reaction material spray nozzle N3, the raw material spray nozzle N1, the reaction material spray nozzle N2, and the exhaust nozzle Nd are arranged side by side in the horizontal direction (the X direction). Herein, at least the exhaust nozzle Nd is located on an outermost side of the mist spray head 100 (a right end in FIG. 4).

The mist spray head 100 sprays the atomized raw material to the upper surface of the substrate 110 which is heated at a predetermined temperature. Accordingly, the desired film is formed on the upper surface of the substrate 110. The mounting part 90 moves in the horizontal direction (in the X-Z plane) at the time of film forming processing. The mist spray head 100 moves in the horizontal direction.

Herein, the configuration of the raw material spray nozzle N1, the reaction material spray nozzle N2, and the exhaust nozzle Nd in the mist spray head 100 according to the embodiment 1 is the same as that of the mist spray head 100 according to the present embodiment. Accordingly, the description of the configurations of these members N1, N2, and Nd is omitted here.

The configuration of the reaction material spray nozzle N3 is the same as that of the reaction material spray nozzle N2.

That is to say, the reaction material spray nozzle N3 is a nozzle for ejecting a reaction material which contributes to a reaction with the raw material (the reaction material may be the same as or different from the reaction material sprayed from the reaction material spray nozzle N2) to the substrate 110. Cavities (referred to as a second cavity) 22 and 23 are formed inside the reaction material spray nozzle N3. A reaction material supply part 21 is provided in an upper surface of the reaction material spray nozzle N3. The reaction material is supplied from outside the reaction material spray nozzle N3 into the cavities 22 and 23 via the reaction material supply part 21.

Herein, the reaction material may be gas or liquid. When the reaction material is the liquid, the liquid (the reaction material) atomized using ultrasonic vibration, for example, passes through a route not shown in the drawings together with a carrier gas and is conveyed to the reaction material spray nozzle N3. The reaction material which is output from the reaction material supply part 21 fills (is supplied to) the cavities 22 and 23 in the reaction material spray nozzle N3.

A straightening part (referred to as the second straightening unit) 24 is provided on one side surface portion in the cavities 22 and 23 of the reaction material spray nozzle N3. The straightening part 24, which is a straightening plate, can straighten a flow of the reaction material supplied from the reaction material supply part 21 in the cavities 22 and 23.

The straightening part 24 extends from one side surface portion toward other side surface portion in the cavities 22 and 23 of the reaction material spray nozzle N3. Herein, the other side surface portion faces the one side surface portion in the X direction. One edge portion of the straightening part 24 is attached to the one side surface portion near the upper part of the reaction material spray nozzle N3, however, other edge portion of the straightening part 24 is not connected to the other side surface portion, so that a small gap is formed between the other edge portion and the other side surface portion. The straightening part 24 is provided in the cavities 22 and 23 so as to extend obliquely in a lower direction from the one edge portion to the other edge portion.

The straightening part 24 separates the cavities 22 and 23 into a small space 22 located in an upper part of the reaction material spray nozzle N3 and a small space 23 located in a lower part of the reaction material spray nozzle N3. The small space 22 and the small space 23 are connected to each other via the gap formed between the other edge portion of the straightening part 24 and the other side surface portion. The small space 22 is connected to the reaction material supply part 21, and the small space 23 is connected to a reaction material discharge part 25 which will be described hereinafter.

The reaction material discharge part 25 is provided on the one side surface portion described above in the cavities 22 and 23 (more specifically, the small space 23). The reaction material discharge part 25 is provided in a position being away from a bottom surface of the reaction material spray nozzle N2 (the cavities 22 and 23).

In the mist spray head 100, a reaction material ejection part 27 is provided in the bottom surface of the mist spray head 100, that is to say, in the side of the mist spray head 100 which faces the substrate 110. The reaction material is ejected from the reaction material ejection part 27 to the substrate 110.

A path 26 is provided in the mist spray head 100. The reaction material discharge part 25 is connected to the reaction material ejection part 27 via the path 26. As shown in FIG. 6, the reaction material ejection part 27 forms an elongated opening hole having a slit-like shape. A width of the opening (a size in the X direction in FIG. 6) is substantially 0.1 mm to 10 mm.

In the reaction material spray nozzle N3, the reaction material is supplied from the reaction material supply part 21 into the cavities 22 and 23. Then, the reaction material is straightened by the straightening part 24 and fills the small space 22, and subsequently, it is led to the small space 23 to fill the small space 23. Then, the reaction material is led from the reaction material discharge part 25 to the reaction material ejection part 27 via the path 26. The reaction material is ejected from the reaction material ejection part 27 to the upper surface of the substrate 110.

As shown in FIGS. 4 and 6, the reaction material ejection part 27, the raw material ejection part 7, the reaction material ejection part 17, and the exhaust part d7 are arranged in this order in the X direction.

The exhaust nozzle Nd is disposed separately from other nozzles N1, N2, and N3 in the X direction. Accordingly, an open ceiling part 35 is generated between the exhaust nozzle Nd and the other nozzles N1, N2, and N3. Thus, the mist spray head 100 is provided with a base plate part 36. The base plate part 36 covers the open ceiling part 35 from a side where the substrate 110 is located (refer to FIGS. 4 and 6).

In the present embodiment, the base plate part 36 is provided with an inactive gas supply part (not shown), a path 44, and an inactive gas ejection part 38 (refer to FIGS. 4 and 6).

An inactive gas which is sent from outside of the mist spray head 100 is supplied to the base plate part 36 via the inactive gas supply part. The path 44 is provided in the base plate part 36, and the supplied inactive gas moves in the path 44. The inactive gas ejection part 38 is provided in a side of the base plate part 36 which faces the substrate 110, and the inactive gas is sprayed from the inactive gas ejection part 38 toward the substrate 110. As shown in FIG. 6, the inactive gas ejection part 38 forms an elongated opening hole having a slit-like shape. A width of the opening (a size in the X direction in FIG. 6) is substantially 0.1 mm to 10 mm.

The base plate part 36 according to the embodiment 1 is not provided with the inactive gas supply part, the path 44, and the inactive gas ejection part 38 described above. However, the base plate part 36 according to the embodiment 1 may also be provided with the inactive gas supply part, the path 44, and the inactive gas ejection part 38 in a similar manner to the base plate part 36 according to the present embodiment.

Moreover, the base plate part 36 according to the present embodiment is provided with a temperature adjustment part 28 inside thereof. The temperature adjustment part 28 can adjust a temperature in the base plate part 36.

The base plate part 36 according to the embodiment 1 is not provided with the temperature adjustment part 28 described above. However, the base plate part 36 according to the embodiment 1 may also be provided with the temperature adjustment part 28 in a similar manner to the base plate part 36 according to the present embodiment.

Herein, in the present embodiment, temperature adjustment parts 8, 18, and 28 are provided also in the raw material spray nozzle N1 and the reaction material spray nozzles N2 and N3. The raw material spray nozzle N1 and the reaction material spray nozzle N2 according to the embodiment 1 are not provided with the temperature adjustment parts 8 and 18 described above. However, the raw material spray nozzle N1 and the reaction material spray nozzle N2 according to the embodiment 1 may also be provided with the temperature adjustment parts 8 and 18 in a similar manner to the raw material spray nozzle N1 and the reaction material spray nozzle N2 according to the present embodiment.

With reference to FIG. 6, the mist spray head 100 includes a frame 30 of the mist spray head 100 in the side (bottom surface) of the mist spray head 100 which faces the substrate 110. The frame 30, which is an edge portion of the bottom surface of the mist spray head 100, rims and surrounds an inner portion side of the bottom surface of the mist spray head 100. As can be seen from FIG. 4, the frame 30 protrudes toward the substrate 110 side.

That is to say, the reaction space is enclosed by the frame 30. However, the edge portion of the frame 30 and the upper surface of the substrate 110 are not in contact with each other.

Moreover, refer to FIGS. 4 to 6, in the present embodiment, the mist spray head 100 is provided with inactive gas supply parts 39 and 41, paths 45 and 46, and inactive gas ejection parts 40 and 42.

The inactive gas which is sent from outside of the mist spray head 100 is supplied into the mist spray head 100 via the inactive gas supply parts 39 and 41. The paths 45 and 46 are provided in the mist spray head 100, and the supplied inactive gas moves in the paths 45 and 46. The inactive gas ejection parts 40 and 42 are provided in a side of the mist spray head 100 which faces the substrate 110, and the inactive gas is sprayed from the inactive gas ejection parts 40 and 42 to the substrate 110.

As shown in FIG. 6, each of the inactive gas ejection parts 40 and 42 forms an elongated opening hole having a slit-like shape. A width of each opening (a size of the inactive gas ejection part 40 in the X direction in FIG. 6 and a size of the inactive gas ejection part 42 in a Z direction in FIG. 6) is substantially 0.1 mm to 10 mm.

As shown in FIGS. 4 and 6, in an edge portion of the mist spray head 100 on the opposite side of the exhaust nozzle Nd, the inactive gas ejection part 40 is provided in the frame 30 described above or a region adjacent to the frame 30. As shown in FIGS. 5 and 6, in edge portions of the mist spray head 100 located in a front and back sides in FIG. 4, the inactive gas ejection part 42 is provided in the frame 30 described above or regions adjacent to the frame 30.

The mist spray head 100 according to the embodiment 1 is not provided with the inactive gas supply parts 39 and 41, the paths 45 and 46, and the inactive gas ejection parts 40 and 42 described above. However, the mist spray head 100 according to the embodiment 1 may also be provided with the inactive gas supply parts 39 and 41, the paths 45 and 46, and the inactive gas ejection parts 40 and 42 in a similar manner to the mist spray head 100 according to the present embodiment.

When the atomized raw material and the reaction material are sprayed to the reaction space, the raw material and the reaction material react with each other on the heated substrate 110, and the desired film is thereby formed on the upper surface of the substrate 110. A reaction residue generated in the reaction space, for example, is removed from the reaction space by the exhaust nozzle Nd.

As described above, the mist spray head 100 according to the present embodiment has the two reaction material spray nozzles N2 and N3. Herein, the raw material spray nozzle N1 is sandwiched between the reaction material spray nozzle N2 located in one side and the reaction material spray nozzle N3 located in other side from a lateral side.

Accordingly, different reaction materials can be ejected to the reaction space. Thus, a variety of films can be formed on the substrate 110. When the same reaction material is ejected from the reaction material spray nozzles N2 and N3, a speed of forming the desired film on the substrate 110 can be enhanced.

Each of the reaction material spray nozzles N2 and N3 has a temperature adjustment part. Accordingly, a liquid drop accumulating in the reaction material spray nozzles N2 and N3 can be vaporized, for example. Thus, the vaporized reaction material can be used as the reaction material sprayed from the reaction material spray nozzles N2 and N3.

The raw material spray nozzle N1 is also provided with a temperature adjustment part. Accordingly, for example, the raw material can be kept in a mist state. That is to say, it can be prevented that the liquid drop of the raw material sprayed from the raw material spray nozzle N1 gets large and then the raw material which becomes the large liquid drop drops on the upper surface of the substrate 110.

The base plate part 36 is provided with the inactive gas ejection part 38 which sprays the inactive gas to the substrate 110. Accordingly, the raw material located below the base plate part 36, for example, can be pressed on the surface of the substrate 110. Accordingly, a usage efficiency of the raw material, for example, can be enhanced.

The base plate part 36 has the temperature adjustment part 28. Accordingly, the raw material, for example, can be kept in a mist state in the reaction space. Moreover, an attachment of the liquid drop to the base plate part 36 can be prevented. Furthermore, a film forming reaction on the substrate 110 can be enhanced.

The inactive gas ejection parts 40 and 42 which spray the inactive gas to the substrate 110 are provided in the frame 30 of the mist spray head 100 or adjacent to the frame 30. Accordingly, the reaction space can be enclosed by the inactive gas, so that the diffusion of the raw material, for example, from the reaction space can be suppressed.

Embodiment 3

Figure 7:
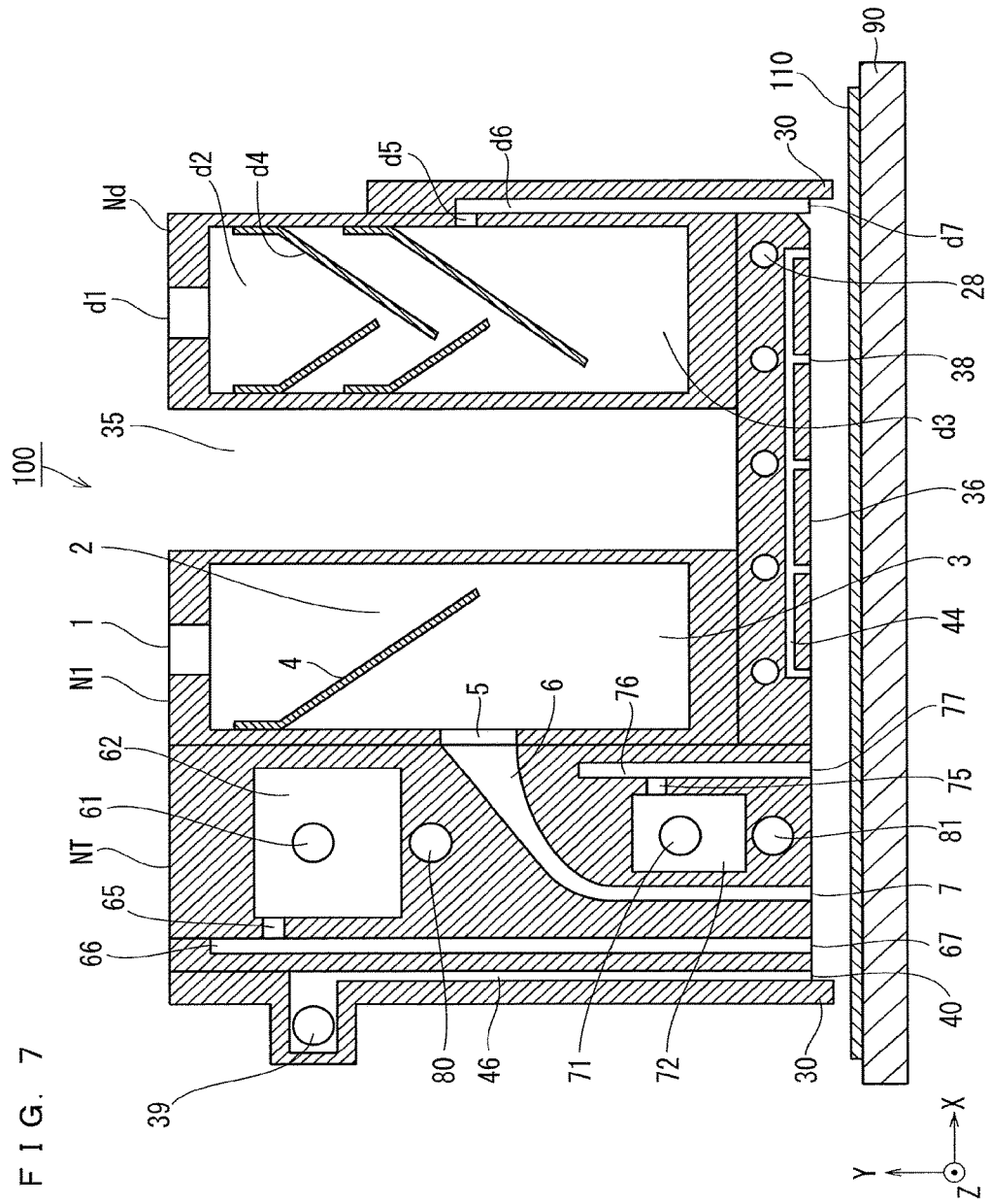
FIG. 7 is an enlarged cross sectional view showing a configuration of the mist spray head 100 according to an embodiment 3.

FIG. 7 is a cross sectional view showing a configuration of a mist spray head 100 according to the present embodiment. FIG. 7 also includes an X-Y-Z coordinate axis. The mist spray head 100 according to the present embodiment viewed in an X direction has an appearance similar to that in FIG. 5.

The mist spray head 100 according to the embodiment 2 includes the two reaction material spray nozzles N2 and N3. The mist spray head 100 according to the present embodiment is provided with one reaction material spray nozzle NT, and two types of reaction materials can be sprayed from the reaction material spray nozzle NT.

The configuration of the reaction material spray nozzle of mist spray head 100 according to the embodiment 2 is different from that of the mist spray head 100 according to the present embodiment, however, another configurations are the same with each other. Accordingly, only the configuration different between the embodiment 2 and the present embodiment is described below.

As shown in FIG. 7, the mist spray head 100 includes the reaction material spray nozzle NT, a raw material spray nozzle N1, and an exhaust nozzle Nd. As shown in FIG. 7, the reaction material spray nozzle NT, the raw material spray nozzle N1, and the exhaust nozzle Nd are arranged side by side in this order along the X direction.

A side surface of the raw material spray nozzle N1 and a side surface of the reaction material spray nozzle NT are in contact with each other. However, other side surface of the reaction material spray nozzle N1 and a side surface of the exhaust nozzle Nd are separated by a predetermined distance. That is to say, the reaction material spray nozzle NT and the raw material spray nozzle N1 are adjacent to each other in the X direction, and the exhaust nozzle Nd is disposed separately from the other nozzles N1 and NT in the X direction.

As described above, the reaction material spray nozzle NT, the raw material spray nozzle N1, and the exhaust nozzle Nd are arranged side by side in the horizontal direction (the X direction). Herein, at least the exhaust nozzle Nd is located on an outermost side of the mist spray head 100 (a right end in FIG. 7).

The mist spray head 100 sprays the atomized raw material to the upper surface of the substrate 110 which is heated at a predetermined temperature. Accordingly, the desired film is formed on the upper surface of the substrate 110. The mounting part 90 moves in the horizontal direction (in the X-Z plane) at the time of film forming processing. The mist spray head 100 moves in the horizontal direction.

Next, the configuration of the reaction material spray nozzle NT is described.

The reaction material spray nozzle NT is a nozzle for ejecting a reaction material which contributes to a reaction with the raw material to the substrate 110. Two cavities 62 and 72 are formed inside the reaction material spray nozzle NT. As shown in FIG. 7, the two cavities 62 and 72 are arranged side by side in a vertical direction (in a Y direction) in the reaction material spray nozzle NT. Specifically, in the reaction material spray nozzle NT, the one cavity 62 is located in an upper side and the other cavity 72 is located in a lower side. Herein, the one cavity 62 and the other cavity 72 are not connected to each other in the reaction material spray nozzle NT but form separate spaces.

As shown in FIG. 7, one reaction material supply part 61 is provided in a side surface of the one cavity 62 in a Z direction. One reaction material is supplied from outside the reaction material spray nozzle NT into the one cavity 62 via the one reaction material supply part 61.

Other reaction material supply part 71 is provided in a side surface of the other cavity 72 in the Z direction. Other reaction material is supplied from outside the reaction material spray nozzle NT into the other cavity 72 via the other reaction material supply part 71.

Herein, each reaction material may be gas or liquid. When the reaction material is the liquid, the liquid (the reaction material) atomized using ultrasonic vibration, for example, passes through a route not shown in the drawings together with a carrier gas and is conveyed to the reaction material spray nozzle NT. The one reaction material which is output from the one reaction material supply part 61 fills (is supplied to) the cavity 62 in the reaction material spray nozzle NT. The other reaction material which is output from the other reaction material supply part 71 fills (is supplied to) the cavity 72 in the reaction material spray nozzle NT.

Although not shown in FIG. 7, a straightening part having the function and the action described in the embodiments 1 and 2 (that is to say, a flow of the reaction material is straightened in the cavities 62 and 72, and even when the reaction material and an atmosphere react with each other and particles are thereby generated, a trapping of the particles in a region between the bottom surface of the cavities 62 and 72 and the reaction material discharge parts 65 and 75 is enhanced) may be provided in the cavities 62 and 72.

The one reaction material discharge part 65 is provided in a side surface of the one cavity 62 in the X direction. The one reaction material discharge part 65 is provided in a position being away from a bottom surface of the one cavity 62.

The other reaction material discharge part 75 is provided in a side surface of the other cavity 72 in the X direction. The other reaction material discharge part 75 is provided in a position being away from a bottom surface of the other cavity 72.

In the mist spray head 100, one reaction material ejection part 67 and other reaction material ejection part 77 are provided in the bottom surface of the mist spray head 100 (the reaction material spray nozzle NT in FIG. 7), that is to say, in a side of the mist spray head 100 which faces the substrate 110. The one reaction material is ejected from the one reaction material ejection part 67 to the substrate 110, and the other reaction material is ejected from the other reaction material ejection part 77 to the substrate 110.

Paths 66 and 76 are provided in the mist spray head 100 (the reaction material spray nozzle NT in the configuration example of FIG. 7). The one reaction material discharge part 65 is connected to the one reaction material ejection part 67 via the path 66. The other reaction material discharge part 75 is connected to the other reaction material ejection part 77 via the path 76.

In the configuration of FIG. 7, a raw material ejection part 7 which ejects the raw material to the substrate 110 is provided in the bottom surface of the reaction material spray nozzle NT. In the present embodiment, the path 6 which connects the raw material discharge part 5 and the raw material ejection part 7 is provided in the reaction material spray nozzle NT.

Thus, in the configuration example of FIG. 7, the one reaction material ejection part 67, the raw material ejection part 7, and the other reaction material ejection part 77 are arranged in the side of the mist spray head 100 which faces the substrate 110 in this order in the X direction. Each of the reaction material ejection parts 67 and 77 and raw material ejection part 7 forms an elongated opening hole having a slit-like shape. A width of each opening (a size in the X direction in FIG. 7) is substantially 0.1 mm to 10 mm.

The one reaction material is supplied from the one reaction material supply part 61 into the cavity 62 in the reaction material spray nozzle NT. Then, the one reaction material fills the cavity 62, and subsequently, it is led from the one reaction material discharge part 65 to the one reaction material ejection part 67 via the path 66. Then the one reaction material is ejected from the one reaction material ejection part 67 toward the upper surface of the substrate 110. The other reaction material is supplied from the other reaction material supply part 71 into the cavity 72. Then, the other reaction material fills the cavity 72, and subsequently, it is led from the other reaction material discharge part 75 to the other reaction material ejection part 77 via the path 76. Then the other reaction material is ejected from the other reaction material ejection part 77 toward the upper surface of the substrate 110.

As shown in FIG. 7, the one reaction material ejection part 67, the raw material ejection part 7, the other reaction material ejection part 77, and the exhaust part d7 are arranged in this order in the X direction.

The exhaust nozzle Nd is disposed separately from other nozzles NT and N1. Accordingly, an open ceiling part 35 is generated between the exhaust nozzle Nd and the other nozzles NT and N1. Thus, also in the present embodiment, the mist spray head 100 is provided with a base plate part 36. The base plate part 36 covers the open ceiling part 35 from a side where the substrate 110 is located (refer to FIG. 7).

The base plate part 36 according to the present embodiment is also provided with an inactive gas supply part (not shown), a path 44, and an inactive gas ejection part 38 in a similar manner to the embodiment 2 so that the inactive gas can be sprayed to the substrate 110. Moreover, the base plate part 36 according to the present embodiment is provided with a temperature adjustment part 28 in a similar manner to the embodiment 2.

In the present embodiment, the reaction material spray nozzle NT is also provided with temperature adjustment parts 80 and 81. The temperature adjustment part 80 performs a temperature adjustment on the one cavity 62. The temperature adjustment part 81 performs a temperature adjustment on the other cavity 72. In the configuration example of FIG. 7, the temperature adjustment of the raw material spray nozzle N1 is performed by part of the temperature adjustment part 28 provided in the base plate part 36.

The mist spray head 100 includes a frame 30 in the side (bottom surface) of the mist spray head 100 which faces the substrate 110 also in the present embodiment. Furthermore, as shown in FIG. 7, also in the present embodiment, the mist spray head 100 is provided with inactive gas supply parts 39 and 41, paths 45 and 46, and inactive gas ejection parts 40 and 42 in a similar manner as the embodiment 2.

When the atomized raw material and the reaction material are sprayed to the reaction space, the raw material and the reaction material react with each other on the heated substrate 110, and the desired film is thereby formed on the upper surface of the substrate 110. A reaction residue generated in the reaction space, for example, is removed from the reaction space by the exhaust nozzle Nd.

As described above, the mist spray head 100 according to the present embodiment is provided with the two cavities 62 and 72 in the one reaction material spray nozzle NT, and two types of reaction materials are sprayed from the one reaction material spray nozzle NT toward the substrate 110.

Accordingly, there is no need to provide the two reaction material spray nozzles N2 and N3 in the mist spray head 100 as described in the embodiment 2 when the two types of reaction materials are sprayed. That is to say, the mist spray head 100 according to the present embodiment enables a space saving.

The invention claimed is:

1. A film forming apparatus which sprays a first material which is atomized to an atmosphere so as to form a film on a substrate, comprising:
   a mounting part on which said substrate is mounted; and
   a mist spray head which sprays said first material to an upper surface of a substrate mounted on said mounting part, wherein
   said mist spray head includes:
   a first material spray nozzle which sprays said first material and
   a first material ejection part which is provided in a side of said mist spray head facing said substrate, so that said first material which is atomized is sprayed to said substrate, and
   said first material spray nozzle includes:
   a first cavity;
   a first material supply part which supplies said first material which is atomized into said first cavity; and
   a first material discharge part which is drilled in a side surface of said first cavity, being away from a bottom surface of said first cavity, and is connected to said first material ejection part;
   said first material spray nozzle further includes a first straightening plate provided in said first cavity to straighten a flow of said first material, and which extends at an oblique angle from one side edge to an opposite side edge of said first material spray nozzle and to divide a space in the first material spray nozzle into the first cavity and a lower second cavity.

2. The film forming apparatus according to claim 1, wherein
   said first material ejection part forms an elongated opening hole having a slit-like shape.

3. The film forming apparatus according to claim 1, wherein
   said mist spray head further includes a reaction material spray nozzle which is provided adjacent to said first material spray nozzle to eject a reaction material which contributes to a reaction with said first material to said substrate.

4. The film forming apparatus according to claim 3, wherein
   said reaction material spray nozzle includes two reaction material spray nozzles, and
   said first material spray nozzle is sandwiched between one of said two reaction material spray nozzles and other one of said two reaction material spray nozzles from a lateral side.

5. The film forming apparatus according to claim 3, wherein
   said mist spray head further includes a reaction material ejection part which is provided in a side of said mist spray head facing said substrate to eject said reaction material to said substrate, and
   said reaction material spray nozzle includes:
   a second cavity;
   a reaction material supply part which supplies said reaction material into said second cavity; and
   a reaction material discharge part which is drilled in a side surface of said second cavity, being away from a bottom surface of said second cavity, and is connected to said reaction material ejection part.

6. The film forming apparatus according to claim 5, wherein
said reaction material spray nozzle further includes a second straightening plate which is provided in said second cavity to straighten a flow of said reaction material.

7. The film forming apparatus according to claim 5, wherein
said reaction material ejection part forms an elongated opening hole having a slit-like shape.

8. The film forming apparatus according to claim 3, wherein
said reaction material includes two reaction materials,
said mist spray head further includes:
one reaction material ejection part which is provided in a side of said mist spray head facing said substrate to eject one of said two reaction materials to said substrate; and
other reaction material ejection part which is provided in a side of said mist spray head facing said substrate to eject other one of said two reaction materials to said substrate, and
said reaction material spray nozzle includes:
one cavity;
other cavity which is formed separately from the one cavity;
one reaction material supply part which supplies said one of said two reaction materials into said one cavity;
other reaction material supply part which supplies said other one of said two reaction materials into said other cavity;
one reaction material discharge part which is drilled in a side surface of said one cavity, being away from a bottom surface of said one cavity, and is connected to said one reaction material ejection part; and
other reaction material discharge part which is drilled in a side surface of said other cavity, being away from a bottom surface of said other cavity, and is connected to said other reaction material ejection part.

9. The film forming apparatus according to claim 8, wherein
said reaction material spray nozzle further includes:
one straightening plate which is provided in said one cavity to straighten a flow of said one of said two reaction materials; and
other straightening plate which is provided in said other cavity to straighten a flow of said other one of said two reaction materials.

10. The film forming apparatus according to claim 8, wherein
each of said one reaction material ejection part and said other reaction material ejection part forms an elongated opening hole having a slit-like shape.

11. The film forming apparatus according to claim 3, wherein
said reaction material spray nozzle further includes a temperature adjustment part which adjusts a temperature.

12. The film forming apparatus according to claim 3, wherein
said mist spray head further includes an exhaust nozzle which performs an exhaust processing.

13. The film forming apparatus according to claim 12, wherein said exhaust nozzle is configured to perform exhaust processing at a flow rate which is equal to or larger than a sum of a flow rate at which said first material spray nozzle ejects said first material and a flow rate at which said reaction material spray nozzle ejects said reaction material.

14. The film forming apparatus according to claim 12, wherein
said first material spray nozzle, said reaction material spray nozzle, and said exhaust nozzle are arranged side by side in a horizontal direction, and
at least said exhaust nozzle is located on an outermost side of said mist spray head.

15. The film forming apparatus according to claim 12, wherein
said mist spray head further includes an exhaust part which is provided in a side of said mist spray head facing said substrate to perform said exhaust processing on a space between said substrate and said mist spray head, and
said exhaust nozzle includes:
a third cavity;
an exhaust material introduction part which is drilled in a side surface of said third cavity, being away from a bottom surface of said third cavity, and is connected to said exhaust part; and
an exhaust material outlet which is provided superior to said exhaust material introduction part to discharge said exhaust material outside said exhaust nozzle from said third cavity.

16. The film forming apparatus according to claim 15, wherein
said exhaust nozzle further includes a third straightening part which is provided in said third cavity to straighten a flow of said exhaust material.

17. The film forming apparatus according to claim 15, wherein
said exhaust part forms an elongated opening hole having a slit-like shape.

18. The film forming apparatus according to claim 12, wherein
said mist spray head further includes:
an open ceiling part which is provided between said first material spray nozzle and said exhaust nozzle; and
a base plate part which covers said open ceiling part from a side where said substrate is located.

19. The film forming apparatus according to claim 18, wherein
said base plate part is provided with an inactive gas ejection part which sprays an inactive gas to said substrate.

20. The film forming apparatus according to claim 19, wherein
said inactive gas ejection part forms an elongated opening hole having a slit-like shape.

21. The film forming apparatus according to claim 18, wherein
said base plate part includes a temperature adjustment part which adjusts a temperature.

22. The film forming apparatus according to claim 1, wherein
in said mist spray head, a frame which is provided in a side of said mist spray head facing said substrate protrudes toward said substrate side.

23. The film forming apparatus according to claim 1, wherein said mist spray head includes a frame in a side facing said substrate, and an inactive gas ejection part which sprays an inactive gas to said substrate is provided in said frame or a region adjacent to said frame.

24. The film forming apparatus according to claim 23, wherein
said inactive gas ejection part forms an elongated opening hole having a slit-like shape.

25. The film forming apparatus according to claim 1, wherein
said mounting part heats said substrate.

26. The film forming apparatus according to claim 1, wherein
said mounting part moves in a horizontal direction.

27. The film forming apparatus according to claim 1, wherein
said mist spray head moves in a horizontal direction.

* * * * *